United States Patent
Maples et al.

(10) Patent No.: US 9,728,483 B2
(45) Date of Patent: Aug. 8, 2017

(54) METHOD OF FORMING AN INTEGRATED CIRCUIT WITH HEAT-MITIGATING DIAMOND-FILLED CHANNELS

(71) Applicant: HONEYWELL FEDERAL MANUFACTURING & TECHNOLOGIES, LLC, Kansas City, MO (US)

(72) Inventors: Kyle W. Maples, Kansas City, MO (US); Daniel J. Ewing, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 14/964,217

(22) Filed: Dec. 9, 2015

(65) Prior Publication Data
US 2017/0170093 A1    Jun. 15, 2017

(51) Int. Cl.
| | | |
|---|---|---|
| *H01L 23/34* | (2006.01) | |
| *H01L 23/373* | (2006.01) | |
| *H01L 29/20* | (2006.01) | |
| *H01L 29/205* | (2006.01) | |
| *H01L 29/15* | (2006.01) | |
| *H01L 29/778* | (2006.01) | |
| *H01L 29/66* | (2006.01) | |
| *H01L 21/48* | (2006.01) | |

(52) U.S. Cl.
CPC ...... *H01L 23/3732* (2013.01); *H01L 21/4871* (2013.01); *H01L 29/157* (2013.01); *H01L 29/2003* (2013.01); *H01L 29/205* (2013.01); *H01L 29/66462* (2013.01); *H01L 29/7787* (2013.01)

(58) Field of Classification Search
CPC .................... H01L 29/785; H01L 29/205
See application file for complete search history.

(56) References Cited

U.S. PATENT DOCUMENTS

| | | | | |
|---|---|---|---|---|
| 5,955,781 A | * | 9/1999 | Joshi | ........... H01L 23/3677 257/347 |
| 7,582,962 B1 | * | 9/2009 | Pavio | ........... H01L 23/373 257/705 |
| 7,820,488 B2 | | 10/2010 | Sri-Jayantha et al. | |
| 2004/0119161 A1 | * | 6/2004 | Saito | ........... H01L 23/3732 257/729 |

(Continued)

*Primary Examiner* — Thao P Le
(74) *Attorney, Agent, or Firm* — Hovey Williams LLP (57) ABSTRACT

An integrated circuit and method of forming the integrated circuit, including the steps of forming channels partially into a thickness of a semiconductor layer or through the thickness of the semiconductor layer and partially through a thickness of a substrate layer on which the semiconductor layer was formed. The method may then include underfilling or overfilling the channels with diamond. If underfilled, a remainder of the channels may be filled in with nucleation buffer layers or additional semiconductor material. If overfilled, the diamond may be selectively polished down to form a planar surface with the semiconductor layer. Next, the method may include forming an active device layer over the semiconductor material and diamond. The method may also include thinning the substrate layer down to the diamond and then placing a heat sink in physical contact with the diamond in the channel.

21 Claims, 5 Drawing Sheets

(56) References Cited

U.S. PATENT DOCUMENTS

| | | | |
|---|---|---|---|
| 2007/0205792 A1* | 9/2007 | Mouli | H01L 23/367 324/750.09 |
| 2009/0008709 A1* | 1/2009 | Yedinak | H01L 21/3065 257/331 |
| 2009/0194773 A1 | 8/2009 | Hanson et al. | |
| 2012/0153300 A1* | 6/2012 | Lidow | H01L 21/743 257/77 |
| 2013/0126903 A1 | 5/2013 | Sung | |
| 2015/0056763 A1 | 2/2015 | Hobart et al. | |

* cited by examiner

METHOD OF FORMING AN INTEGRATED CIRCUIT WITH HEAT-MITIGATING DIAMOND-FILLED CHANNELS

BACKGROUND

As integrated circuits become smaller and more complex and consume more power, heat dissipation becomes more problematic. Heat mitigation can be handled by implementing convection cooling methodologies, such as fans, liquid cooling, or miniature heat pipes. However, these solutions and size and weight and are therefore not well suited for thinner and faster integrated circuits.

Various components of an integrated circuit may be supported by a substrate, such as silicon-carbide (SiC) or silicon (Si). Heat sinks may be used to remove heat from a backside of the support substrate. This is adequate for cooling lower power devices, but in higher power devices, the traditional heat sinks are not sufficient, because the support substrate absorbs some of the heat prior to it reaching the heat sink. This can cause a thermal runaway and even cause the integrated circuit to melt, depending on the temperatures reached.

SUMMARY OF THE INVENTION

Embodiments of the present invention solve the above-mentioned problems and provide a distinct advance in the art of integrated circuit heat mitigation techniques.

Some embodiments of the invention include a method of forming an integrated circuit in such a way that facilitates heat dissipation. One such method may include the steps of forming a semiconductor layer made of semiconductor material onto a substrate layer and forming one or more channels partially into a thickness of the semiconductor layer or through the thickness of the semiconductor layer and partially through a thickness of the substrate layer. Next, the method may include the steps of under- or over-filling the channels with diamond and then forming an active device layer over the semiconductor material and the diamond.

The step of under-filling or partially filling the channel with diamond may further include a step of applying nucleation buffer layers and/or additional semiconductor material over the diamond in the channel, and then forming an active device layer over the semiconductor layer and the nucleation buffer layers and/or the additional semiconductor material. Over-filling the channel with the diamond such that the diamond extends outward from the channel may further include a step of selectively etching or chemical mechanical polishing the diamond down until forming a planar surface at a same level as an outer surface of the semiconductor layer and then forming the active device layer over the semiconductor material and diamond. The active device layer may be formed by an epitaxial growth process.

Another embodiment of the invention is an integrated circuit that has a substrate layer made of silicon-carbide (SiC), silicon (Si), and/or bulk gallium nitride and a semiconductor layer formed on the substrate layer. The semiconductor layer may be made of Gallium Nitride (GaN), and one or more channels may be formed into or through a thickness of the semiconductor layer and/or a thickness of the substrate layer. For example, the channels may be trenches formed partially into the thickness of the semiconductor layer or completely through the thickness of the semiconductor layer and partially into the thickness of the substrate layer. Additionally or alternatively, the channels may be vias formed through both the thickness of the semiconductor layer and through the thickness of the semiconductor layer. The integrated circuit may also include diamond deposited into the trenches or vias and an active device layer grown over the semiconductor layer and the diamond. The diamond may be pure laser-deposited diamond, diamond composite, or chemical vapor deposition (CVD) diamond doped with another element such as boron. The active device layer may be formed by epitaxial growth and may be grown directly onto nucleation buffer layers applied between the diamond and the active device layer.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
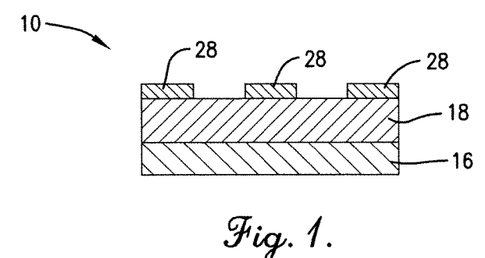
FIG. 1 is a cross-sectional view of a substrate layer and a semiconductor layer of an integrated circuit constructed according to embodiments of the present invention.
Figure 7A:
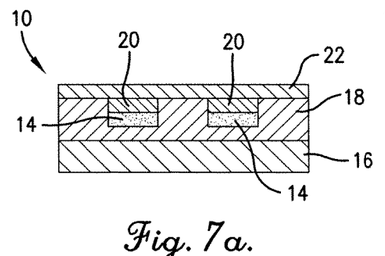
FIG. 7a is a cross-sectional view of the integrated circuit of FIG. 6a, with an active device layer formed over the nucleation buffer layers and the semiconductor layer.
Figure 7B:
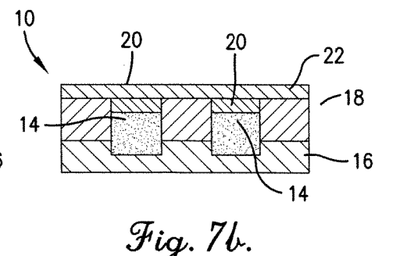
FIG. 7b is a cross-sectional view of the integrated circuit of FIG. 6b, with the active device layer formed over the nucleation buffer layers and the semiconductor layer.

Embodiments of the invention include an integrated circuit 10 and a method of manufacturing the integrated circuit with heat-dissipating channels 12 at least partially filled with diamond 14. The figures herein illustrate the integrated circuit 10 in various stages of completion during manufacturing thereof. For example, FIG. 1 illustrates the integrated circuit 10 before the heat-dissipating channels 12 are formed therein, while FIGS. 2a-3b illustrate the integrated circuit 10 after the channels 12 are formed therein, and FIGS. 4a-5, 8a-9b, 11a, and 11b illustrate the integrated circuit 10 after the diamond 14 is added into the channels 12. The completed integrated circuit 10, as illustrated in FIGS. 7a, 7b, 10a, 10b, 13a, 13b, and 15, may comprise a substrate layer 16, a semiconductor layer 18, the diamond 14, and an active device layer 22. In some embodiments of the invention, the integrated circuit 10 may additionally include nucleation buffer layers 20, as illustrated in FIGS. 7a and 7b.

The substrate layer 16 may include any substrate material known in the art and may be a rigid material with a low conductivity. For example, the substrate layer 16 may be made of silicon-carbide (SiC), silicon (Si), and/or bulk gallium nitride. The substrate may be molded, trimmed, and/or otherwise formed using any techniques known in the art.

Figure 2A:
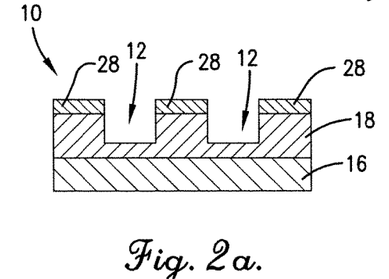
FIG. 2a is a cross-sectional view of the integrated circuit of FIG. 1, with trenches formed into the semiconductor layer in regions uncovered by photoresistive material.
Figure 2B:
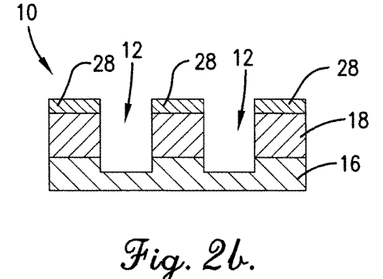
FIG. 2b is a cross-sectional view of the integrated circuit of FIG. 1, with trenches formed through the semiconductor layer and partially into the substrate layer in regions uncovered by the photoresistive material.
Figure 3A:
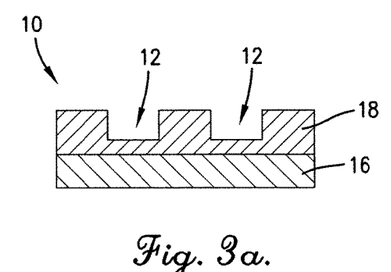
FIG. 3a is a cross-sectional view of the integrated circuit of FIG. 2a, with the photoresistive material removed.
Figure 3B:
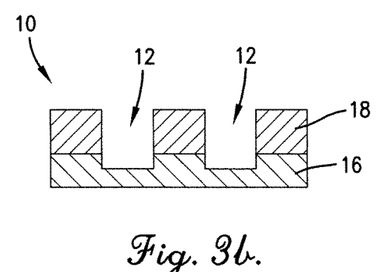
FIG. 3b is a cross-sectional view of the integrated circuit of FIG. 2b, with the photoresistive material removed.
Figure 4A:
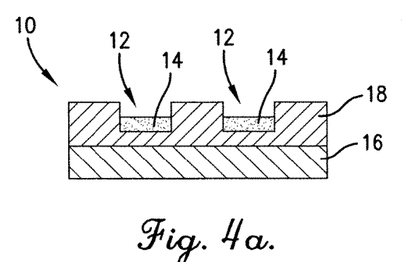
FIG. 4a is a cross-sectional view of the integrated circuit of FIG. 3a, with the trenches partially filled with diamond.
Figure 4B:
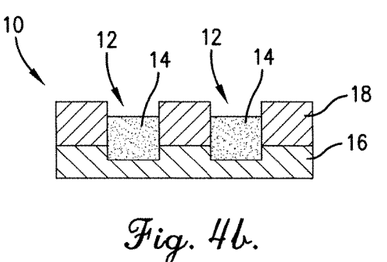
FIG. 4b is a cross-sectional view of the integrated circuit of FIG. 3b, with the trenches partially filled with diamond.
Figure 5:
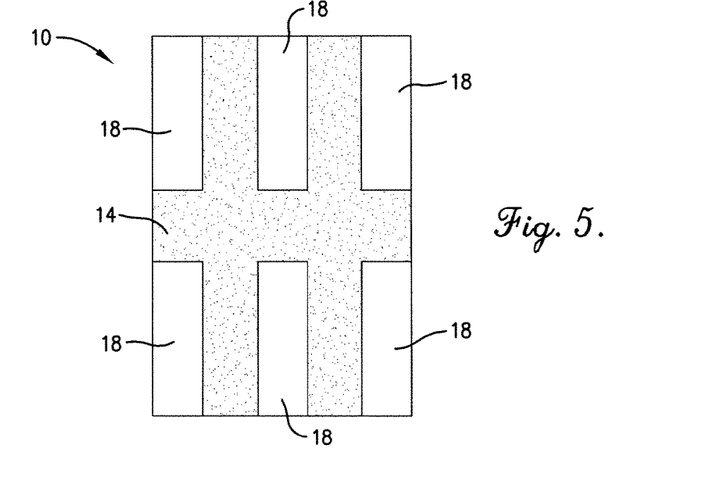
FIG. 5 is a top plan view of the integrated circuit of FIG. 3a, illustrating intersections of the trenches and the diamond filled therein.
Figure 15:
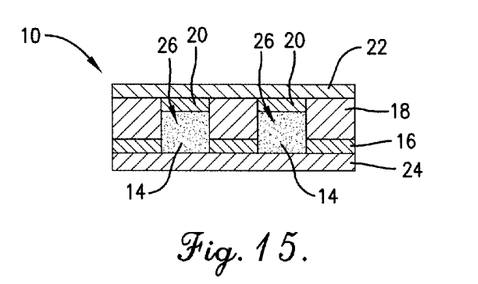
FIG. 15 is a cross-sectional view of the integrated circuit of FIG. 7b, illustrating a portion of the substrate layer removed so that the trenches are converted into vias extending completely through the substrate layer and the semiconductor layer, and coupling the diamond to a heat sink by way of the via.

The semiconductor layer 18, as illustrated in FIGS. 1-13b and 15, may be formed onto the substrate layer 16 and may be made of gallium nitride (GaN) or other suitable base materials for epitaxial growth of active device layers in integrated circuits. The channels 12 may be narrow trenches formed into the semiconductor layer 18, as illustrated in FIGS. 2a and 3a, and/or formed through the semiconductor layer 18 and partially into the substrate layer 16, as illustrated in FIGS. 2b and 3b. In some embodiments of the invention, a thickness of the substrate layer 16 may be removed after the trenches are filled with the diamond 14, such that the trenches then become vias 26 formed all the way through both the semiconductor layer 18 and the substrate layer 16, as illustrated in FIG. 15. Alternatively, the channels 12 may be initially formed as vias extending all the way through both the semiconductor layer 18 and the substrate layer 16 without departing from the scope of the invention.

The diamond 14, as illustrated in FIGS. 4a-13b and 15, may comprise pure laser-deposited diamond, diamond composite, and/or chemical vapor deposition (CVD) diamond doped with another element, such as boron. The diamond 14 may have a coefficient of thermal conductivity sufficient to remove unnecessary heat and may have a low enough coefficient of thermal expansion to not risk cracking the integrated circuit's substrates, such as the substrate layer 16 and/or the semiconductor layer 18. The diamond 14 must generally be deposited at a much higher temperature than the temperature of the active device layer 22. Thus, the deposition of the diamond 14 into the channels 12 is performed in a pre-foundry process, before the active device layer 22 is formed on the integrated circuit 10, as later described herein. The diamond 14 may fill only a portion of one of the channels 12, completely fill the channels 12, and/or over-fill the channels 12 and then be filed, cut, or polished down to a desired thickness, as later described herein.

The nucleation buffer layers 20, as illustrated in FIGS. 4a-7b may comprise a thin metal layer above the diamond 14 to provide a material for the active region technology of the active device layer 22 to grow on. The nucleation buffer layers 20 may comprise super-lattices and/or layers of aluminum nitride (AlN) and gallium nitride (GaN). The nucleation buffer layers 20 may be disposed between the diamond 14 and the active device layer 22 and/or between the semiconductor layer 18 and the active device layer 22. The nucleation buffer layers 20 may be grown by standard techniques, such as MOCVD for GaN, and may be configured to provide stress relief between the diamond 14 and the active device layer 22. For example, the nucleation buffer layers 20 may comprise a 20-period AlN (3 nm)/GaN (17 nm) multi-layer configuration. The precise configuration of the nucleation buffer layers 20 may depend upon the thermal expansion mismatch and/or lattice mismatch between the diamond 14 and the active device layer 22.

The active device layer 22, as illustrated in FIGS. 7a, 7b, 10a, 10b, 13a, and 13b, may comprise a variety of known integrated circuit components, as known in the art, such as power amplifiers, transistors, and the like. For example, the active device layer 22 may comprise a GaN power amplifier having a transistor region with a source, gate, and drain. Typically, area between the gate and the drain may have the highest temperature, requiring the most heat mitigation. The active device layer 22 may be formed using any methods known in the art, but may preferably be formed using epitaxial growth processes known in the art. For example, epitaxial growth may grow single crystal, thin film materials, layer-by-layer, on top of the semiconductor layer 18, the diamond 14, and/or the nucleation buffer layers 20.

In some embodiments of the invention, the integrated circuit 10 may further comprise and/or be coupled to a heat sink 24, as illustrated in FIG. 15, such as a thermal brick or any other bulk thermal management material known in the art. For example, the heat sink 24 may be a copper element or a copper section formed in a non-active region on or in the semiconductor layer 18 and/or the substrate layer 16. The heat sink 24 may be placed in physical contact with a portion of the diamond 14 at edges of the integrated circuit 10, on a back side of the substrate layer 16, opposite the active device layer 22, or any suitable location which draws heat from the diamond 14 and removes that heat from the active device layer 22 or other areas of the integrated circuit 10 at which heat is undesired.

A method of forming the integrated circuit 10 described above may generally include the steps of etching the channels 12 into the semiconductor layer 18 and/or the substrate layer 16, filling the channels 12 with the diamond 14, and then growing the active device layer 22 directly on top of the diamond 14, with or without nucleation buffer layers 20 disposed between the diamond 14 and the active device layer 22.

Figure 14:
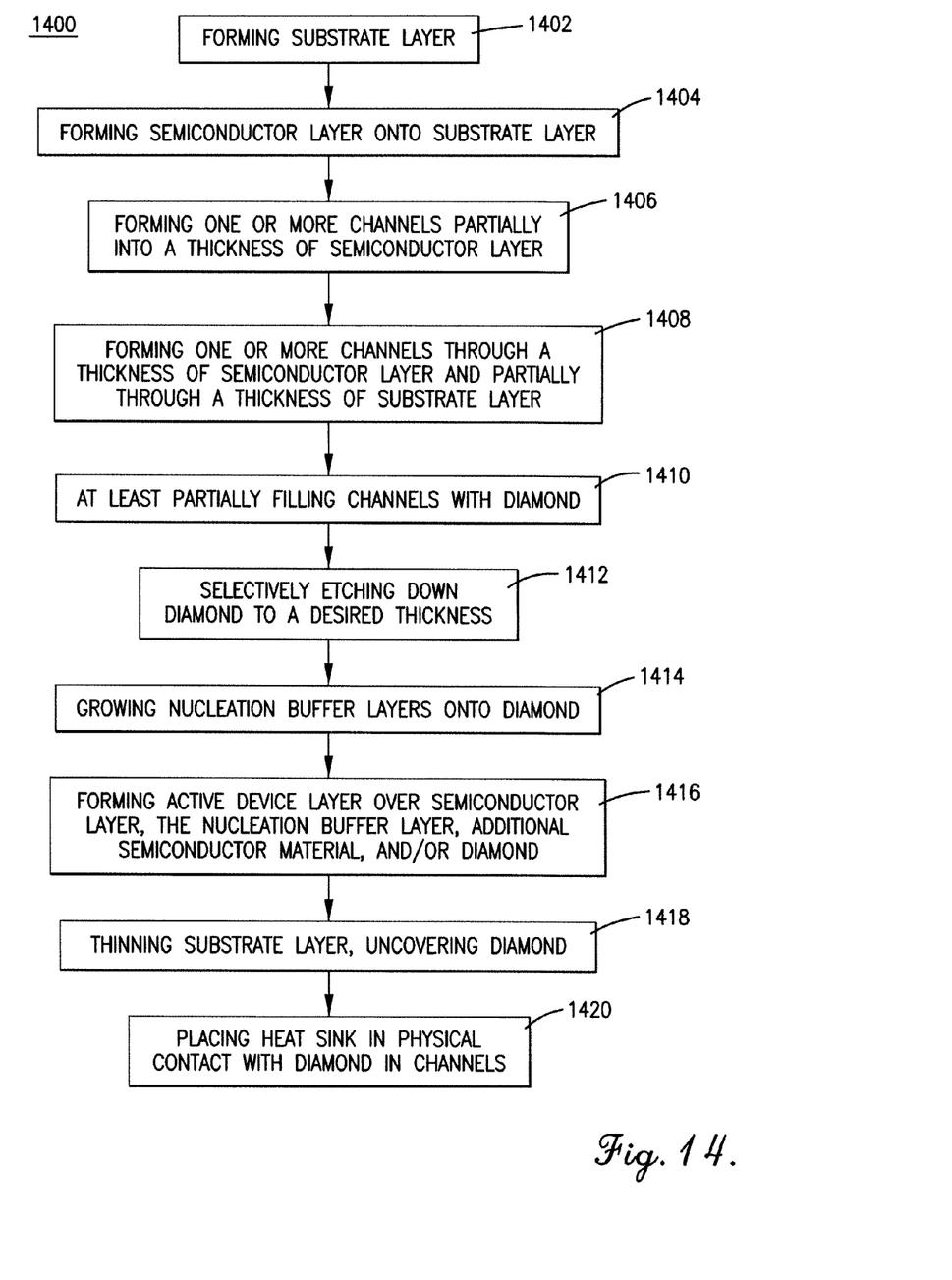
FIG. 14 is a flow chart illustrating a method of forming an integrated circuit in accordance with embodiments of the present invention.

Method steps for forming the integrated circuit 10 herein will now be described in more detail, in accordance with various embodiments of the present invention. The steps of the method 1400 may be performed in the order as shown in FIG. 14, or they may be performed in a different order. Furthermore, some steps may be performed concurrently as opposed to sequentially. In addition, some steps may not be performed.

The method 1400 of forming the integrated circuit 10 may include a step of forming the substrate layer 16, as depicted in block 1402, and then forming the semiconductor layer 18 onto the substrate layer 16, as depicted in block 1404 and illustrated in FIG. 1. As noted above, the semiconductor layer may be made of GaN or other materials having properties similar thereto. For example, thick GaN epitaxial layers may be grown onto a suitable substrate such as SiC, Si, or bulk GaN. The overall thickness of the resulting wafer may be between 250 um to 500 um, and may include the substrate layer 16, the semiconductor layer 18, and/or buffer layers such as the nucleation buffer layers 20 described above.

Next, the method 1400 may include a step of forming one or more of the channels 12 or trenches partially into a thickness of the semiconductor layer 18, as depicted in block 1406 and illustrated in FIGS. 2a and 3a, or through a thickness of the semiconductor layer 18 and partially through a thickness of the substrate layer 16, as depicted in block 1408 and illustrated in FIGS. 2b and 3b. For example, as illustrated in FIG. 1, the channels 12 may be formed by placing photoresistive material 28 onto the semiconductor layer 18 in areas where the channels 12 are not to be formed, and leaving gaps in the photoresistive material 28 at locations where the channels 12 are desired. Then photolithography may be used to etch the channels 12 into the semiconductor layer 18, as illustrated in FIG. 2a, and/or partially into the substrate layer 16, as illustrated in FIG. 2b, using standard reactive ion etch chemistries. Locations of the channels 12 may correspond to locations where primary heat issues are known for a given specific integrated circuit being formed. Once the channels 12 are formed, the photoresistive material 28 may be removed, as illustrated in FIGS. 3a and 3b.

Next, the method 1400 may include at least partially filling the channels with the diamond 14, as depicted in block 1410 and illustrated in FIGS. 4a, 4b, 11a, and 11b, using pure laser deposition, chemical vapor deposition (CVD), or other methods of diamond deposition known in the art. As noted above, the diamond 14 may be pure diamond or diamond composite materials, such as diamond doped with boron or other elements. In some embodiments of the invention, creating CVD diamond and doping it with another element may depend on desired electrical properties for a given end application. For example, the diamond can be doped with elements that encourage more electrically-conductive or more electrically-isolate diamond. Furthermore, the diamond 14 can be designed for a desired coefficient of thermal expansion (CTE), such as 0.8 units. This is in contrast to typical CTEs of approximately 5.4 units for substrates typically used in integrated circuits, such as gallium arsenide (GaAs), GaN, SiC, Si, aluminum indium phosphide AlInP, and the like.

Figure 8A:
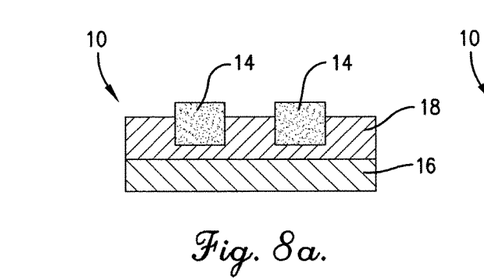
FIG. 8a is a cross-sectional view of the integrated circuit of FIG. 3a, with the trenches overfilled with the diamond.
Figure 8B:
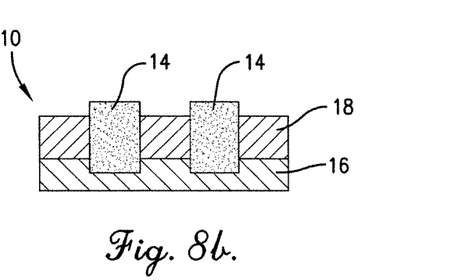
FIG. 8b is a cross-sectional view of the integrated circuit of FIG. 3b, with the trenches overfilled with the diamond.

In some embodiments of the invention, as illustrated in FIGS. 4a, 4b, 5, 11a and 11b, only a portion of one of the channels 12 may be filled, leaving a remaining depth to be filled with another material, as described below. This may be referred to herein as underfilling of the channels 12. Alternatively, as illustrated in FIGS. 8a and 8b, the channels 12 may be overfilled, such that a thickness of the deposited diamond 14 is greater than an overall depth of the channel to which it is applied. In yet another embodiment of the invention, the channels 12 may be fully and precisely filled with the diamond 14, such that a depth of the channel, trench, or via equals a thickness of the diamond 14 deposited therein. However, in practice, such precision may be difficult to achieve without using the underfill or overfill techniques described above.

Figure 9A:
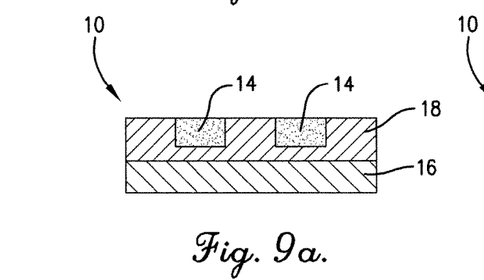
FIG. 9a is a cross-sectional view of the integrated circuit of FIG. 8a, with the diamond etched or polished down to form a planar surface with the semiconductor layer.
Figure 9B:
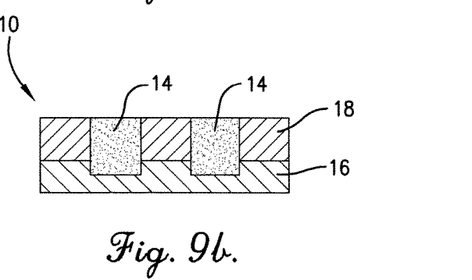
FIG. 9b is a cross-sectional view of the integrated circuit of FIG. 8b, with the diamond etched or polished down to form the planar surface with the semiconductor layer.
Figure 10A:
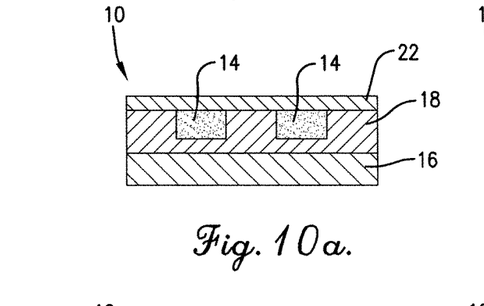
FIG. 10a is a cross-sectional view of the integrated circuit of FIG. 9a, with the active device layer formed over the diamond and the semiconductor layer.
Figure 10B:
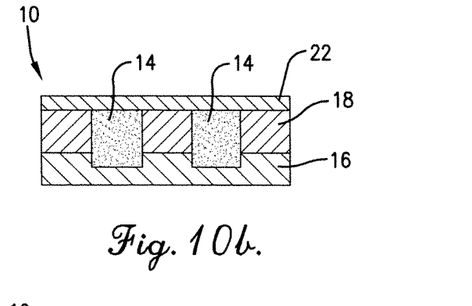
FIG. 10b is a cross-sectional view of the integrated circuit of FIG. 9b, with the active device layer formed over the diamond and the semiconductor layer.
Figure 11A:
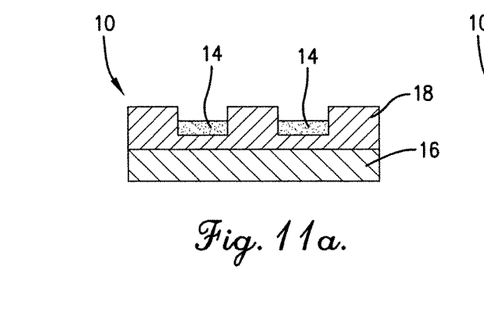
FIG. 11a is a cross-sectional view of the integrated circuit of FIG. 3a, with the trenches partially filled with diamond.
Figure 11B:
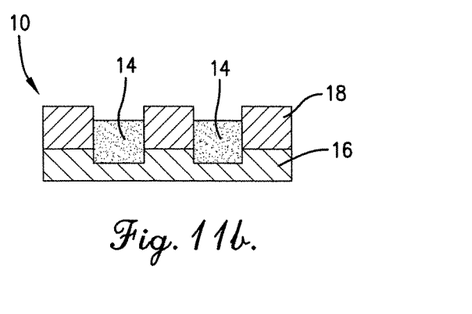
FIG. 11b is a cross-sectional view of the integrated circuit of FIG. 3b, with the trenches partially filled with the diamond.

If the channel or channels 12 are overfilled, the method 1400 may include a step of selectively etching down the diamond 14 to a desired thickness, as depicted in block 1412 and illustrated in FIGS. 9a and 9b. For example, the thickness of the deposited diamond 14 may be greater than an overall depth of the channels 14, so in order to create a planar surface for growing of the active device layer 22, the diamond 14 may be selectively etched down until substantially flush with a top surface of the semiconductor layer 18. This selective etching may be done using chemical mechanical polishing (CMP) or reactive ion etching which is selective to diamond.

Figure 6A:
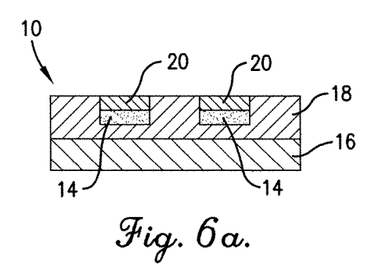
FIG. 6a is a cross-sectional view of the integrated circuit of FIG. 4a, with nucleation buffer layers added over the diamond.
Figure 6B:
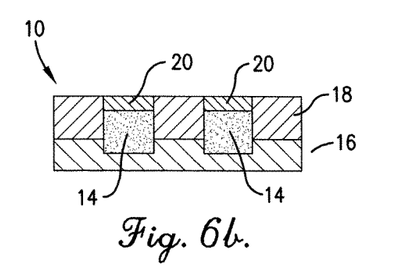
FIG. 6b is a cross-sectional view of the integrated circuit of FIG. 4b, with the nucleation buffer layers added over the diamond.

Next, the method may include a step of growing the nucleation buffer layers 20 onto the diamond 14, as depicted in block 1414 and illustrated in FIGS. 6a and 6b. For example, if the channels 12 or are underfilled with the diamond 14, the unfilled remaining portion of the channels 12 may be filled with the nucleation buffer layers 20. These nucleation buffer layers 20 may be deposited and/or grown on top of the diamond 14 and may form a planar surface, flush with the top surface of the semiconductor layer 18, on which the active device layer 22 may be grown or otherwise applied. In some embodiments of the invention, the nucleation buffer layers 20 may be added by way of a process similar to a damascene process or additive patterning common in advanced Si CMOS manufacturing, providing a thin metal layer above the partially-filled channels 12 for the active device layer to grow on.

As noted above, the nucleation buffer layers 20 may be designed and deposited for material grain matching, as needed, for a given integrated circuit design. The crystal structure of the diamond 14 or the doped CVD crystal will determine what materials are required for the nucleation buffer layers 20 to have compatibility with the active components of active device layer 22 (e.g., GaN, GaAs, Si, AlInP, and the like). In some embodiments of the invention, if the channels 12 are overfilled with the diamond 14 and then polished down, thin nucleation buffer layers 20 may be grown onto the diamond 14 and/or onto the semiconductor layer 18, with the active device layer 22 then formed over that.

Figure 12A:
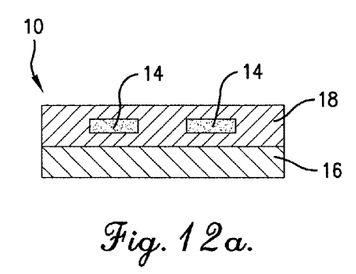
FIG. 12a is a cross-section view of the integrated circuit of FIG. 11a, with additional semiconductor material laterally grown over the diamond.
Figure 12B:
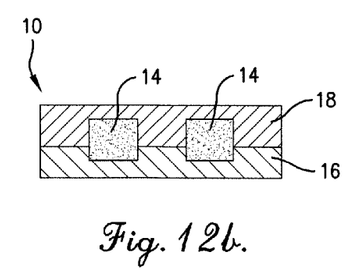
FIG. 12b is a cross-section view of the integrated circuit of FIG. 11b, with the additional semiconductor material laterally grown over the diamond.
Figure 13A:
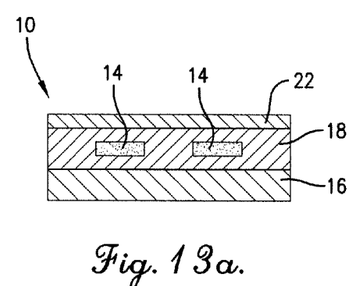
FIG. 13a is a cross-sectional view of the integrated circuit of FIG. 12a, with the active device layer formed over the semiconductor layer and the additional semiconductor material.
Figure 13B:
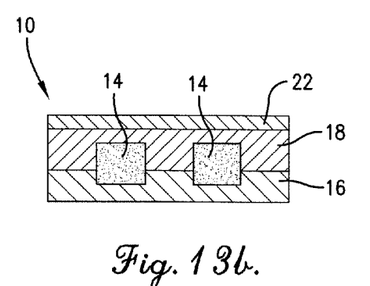
FIG. 13b is a cross-sectional view of the integrated circuit of FIG. 12b, with the active device layer formed over the semiconductor layer and the additional semiconductor material.

In some embodiments of the invention, the nucleation buffer layers 20 in step 1414 may include or be replaced with additional semiconductor material, such as GaN, which may fill the unfilled remaining portion of the underfilled channels 12, as illustrated in FIGS. 12a and 12b. The additional semiconductor material or GaN film layers may be grown on top of the diamond filling, forming a planar surface on which to grow the active device layer 22. This growth may be accomplished using lateral epitaxy overgrowth methods, such as those disclosed in U.S. patent application Ser. No. 12/459,115, incorporated by reference herein in its entirety. Specifically, the additional semiconductor material may be configured to grow from inner side walls of the channel in a direction toward each other until meeting and completely filling a space within the channels 12 between the diamond 14 and a plane flush with the top surface of the semiconductor layer 18. This would eliminate the need for nucleation buffer layers 20, and would planarize the top surface without the need for chemical mechanical polishing (CMP).

Then, as illustrated in FIGS. 7a, 7b, 10a, 10b, 13a, and 13b, the method 1400 may include a step of forming the active device layer 22 over the semiconductor layer 18, the nucleation buffer layers 20, the additional semiconductor material, and/or the diamond 14, as depicted in block 1416, after the cooling of the diamond 14. Specifically, the active device layer 22 may be formed using epitaxial growth processes, as known in the art. This step of forming the active device layer 22 may also be referred to as a foundry process. Advantageously, the steps of depositing the diamond 14 in the channels 12 may preferably be performed as a pre-foundry process, preventing reflow of the active device layer 22 if done post-foundry (after the active device layer 22 was formed on the wafer).

In some embodiments of the invention, the method 1400 may further comprise thinning the substrate layer 16, as depicted in block 1416, all the way down to the diamond-filled channels 12 or trenches, thus converting the channels 12 or trenches into vias 26 that extend completely through the semiconductor layer 18 and the substrate layer 16. These vias 26 may then connect the diamond 14 therein directly to the heat sink 24, thermal brick, or other bulk thermal management material, as illustrated in FIG. 15.

Specifically, the method 1400 may comprise a step of placing the heat sink 24 in physical contact with the diamond 14, as depicted in block 1418, thus providing direct pathways from the heat source to the heat sink 24 or thermal brick by way of the diamond 14 deposited in the channels 12. For example, a thermal brick may be attached to the diamond 14 and the substrate layer 16 at one end of the resulting vias 26, while the active device layer 22 provides heat to the diamond 14 at another opposite end of the vias 26. Additionally or alternatively, a copper element or a copper section may be formed in a non-active region on or in the semiconductor layer 18 and/or the substrate layer 16 and placed in physical contact with a portion of the diamond 14. In yet another embodiment of the invention, a wide metal interconnect could be used to contact the diamond 14 away from an active region of the active device layer 22, and act as a thermal interconnect to remove the heat. The physical location of the heat sink 24 may be embedded into portions of the integrated circuit 10, located at edges of the integrated circuit 10, attached on a back side of the substrate layer 16, opposite the active device layer 22, or placed in any suitable location which draws heat from the diamond 14 and removes that heat from the active device layer 22 or other areas of the integrated circuit 10 at which heat is undesired.

The integrated circuit 10 described herein may be designed for high power application, but also may have applications in multi-chip module assemblies, Low Temperature Co-fired Ceramic (LTCC), and other applications requiring a technique to mitigate heat and/or cool a device quickly.

The diamond described herein has an advantageous coefficient of thermal conductivity to remove the unnecessary heat from the active device layer 22, while also having a low enough coefficient of thermal expansion to not risk cracking the integrated circuit's substrate layer 15 or semiconductor layer 18. However, the diamond 14 is deposited at a much higher temperature than the active device layer 22 can handle. Thus, it is advantageous to deposit the diamond 14 first, as described above, in a prefoundary process, then to apply the active device layer 22 once the diamond 14 has cooled within the channels 12.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of forming an integrated circuit, the method comprising:
   (a) forming a semiconductor layer onto a substrate layer, wherein the semiconductor layer is made of semiconductor material;
   (b) forming at least one channel partially into a thickness of the semiconductor layer or through the thickness of the semiconductor layer and partially through a thickness of the substrate layer;

(c) partially filling the channel with diamond;
(d) filling a remainder of the channel with nucleation buffer layers; and
(e) forming an active device layer over the semiconductor material, the diamond, and the nucleation buffer layers, wherein the nucleation buffer layers are disposed between the diamond and the active device layer.

2. The method of claim 1, wherein the nucleation buffer layers comprise at least one of super-lattices and layers of aluminum nitride (AlN) and gallium nitride (GaN).

3. The method of claim 1, wherein the semiconductor layer is made of gallium nitride (GaN).

4. The method of claim 1, further comprising placing a heat sink in physical contact with the diamond.

5. The method of claim 1, wherein the diamond comprises pure laser-deposited diamond, diamond composite, or chemical vapor deposition (CVD) diamond doped with another element.

6. The method of claim 1, further comprising a step of thinning the substrate layer down to the diamond, such that the channel is a via that extends completely through the semiconductor layer and a remainder of the substrate layer.

7. A method of forming an integrated circuit, the method comprising:
   forming a semiconductor layer onto a substrate layer;
   forming at least one channel partially into a thickness of the semiconductor layer or through the thickness of the semiconductor layer and partially through a thickness of the substrate layer; and
   partially filling the channel with diamond, applying at least one of nucleation buffer layers and additional semiconductor material over the diamond in the channel, and forming an active device layer over the semiconductor layer and the nucleation buffer layers or the additional semiconductor material; or
   over-filling the channel with the diamond such that the diamond extends outward from the channel, selectively etching or chemical mechanical polishing the diamond down until forming a planar surface at a same level as an outer surface of the semiconductor layer, and forming the active device layer over the semiconductor material and diamond,
   wherein the active device layer is formed by an epitaxial growth process.

8. The method of claim 7, wherein the applying step comprises filling a remainder of the channel with the semiconductor material grown therein using lateral epitaxy overgrowth.

9. The method of claim 7, wherein the applying step comprises filling a remainder of the channel with the nucleation buffer layers, wherein the nucleation buffer layers comprise at least one of super-lattices and layers of aluminum nitride (AlN) and gallium nitride (GaN).

10. The method of claim 7, wherein at least one of the semiconductor layer and the additional semiconductor material is made of gallium nitride (GaN), wherein the diamond comprises pure laser-deposited diamond, diamond composite, or chemical vapor deposition (CVD) diamond doped with another element, wherein the substrate layer is made of at least one of silicon-carbide (SiC), silicon (Si), and bulk gallium nitride.

11. The method of claim 7, further comprising a step of thinning the substrate layer down to the diamond, such that the channel is a via that extends completely through the semiconductor layer and a remainder of the substrate layer.

12. The method of claim 11, further comprising placing a heat sink in physical contact with the substrate layer and the diamond uncovered during the thinning step.

13. A method of forming an integrated circuit, the method comprising:
   (a) forming a semiconductor layer onto a substrate layer, wherein the semiconductor layer is made of semiconductor material;
   (b) forming at least one channel partially into a thickness of the semiconductor layer or through the thickness of the semiconductor layer and partially through a thickness of the substrate layer;
   (c) partially filling the channel with diamond;
   (d) filling a remainder of the channel with the semiconductor material; and
   (e) forming an active device layer over the semiconductor material and diamond.

14. The method of claim 13, wherein the semiconductor layer is made of gallium nitride (GaN).

15. The method of claim 13, further comprising placing a heat sink in physical contact with the diamond.

16. The method of claim 13, wherein the diamond comprises pure laser-deposited diamond, diamond composite, or chemical vapor deposition (CVD) diamond doped with another element.

17. The method of claim 13, further comprising a step of thinning the substrate layer down to the diamond, such that the channel is a via that extends completely through the semiconductor layer and a remainder of the substrate layer.

18. A method of forming an integrated circuit, the method comprising:
   (a) forming a semiconductor layer onto a substrate layer, wherein the semiconductor layer is made of semiconductor material;
   (b) forming at least one channel partially into a thickness of the semiconductor layer or through the thickness of the semiconductor layer and partially through a thickness of the substrate layer;
   (c) at least partially filling the channel with diamond;
   (d) forming an active device layer over the semiconductor material and diamond; and
   (e) thinning the substrate layer down to the diamond, such that the channel is a via that extends completely through the semiconductor layer and a remainder of the substrate layer.

19. The method of claim 18, wherein the semiconductor layer is made of gallium nitride (GaN).

20. The method of claim 18, further comprising placing a heat sink in physical contact with the diamond.

21. The method of claim 18, wherein the diamond comprises pure laser-deposited diamond, diamond composite, or chemical vapor deposition (CVD) diamond doped with another element.

* * * * *

UNITED STATES PATENT AND TRADEMARK OFFICE
CERTIFICATE OF CORRECTION

PATENT NO. : 9,728,483 B2
APPLICATION NO. : 14/964217
DATED : August 8, 2017
INVENTOR(S) : Kyle W. Maples and Daniel J. Ewing

Page 1 of 1

It is certified that error appears in the above-identified patent and that said Letters Patent is hereby corrected as shown below:

In the Specification

At Column 1, Line 4 please insert the following paragraph:
-- STATEMENT REGARDING FEDERALLY-SPONSORED RESEARCH OR DEVELOPMENT
This invention was made with government support under Contract No.: DE-NA0000622 awarded by the Department of Energy. The government has certain rights in the invention. --

Signed and Sealed this
Tenth Day of September, 2019

Andrei Iancu
*Director of the United States Patent and Trademark Office*